United States Patent
O'Dowd et al.

(10) Patent No.: US 7,884,733 B2
(45) Date of Patent: Feb. 8, 2011

(54) PROXIMITY DETECTION SYSTEM AND METHOD

(75) Inventors: John O'Dowd, Crecora (IE); Michal Brychta, Raheen (IE)

(73) Assignee: Analog Devices, Inc., Norwood, MA (US)

( * ) Notice: Subject to any disclaimer, the term of this patent is extended or adjusted under 35 U.S.C. 154(b) by 324 days.

(21) Appl. No.: 12/154,124

(22) Filed: May 20, 2008

(65) Prior Publication Data

US 2008/0290929 A1    Nov. 27, 2008

Related U.S. Application Data

(60) Provisional application No. 60/931,446, filed on May 23, 2007.

(51) Int. Cl.
*G08B 21/00* (2006.01)
(52) U.S. Cl. .............................. 340/686.1; 340/539.23
(58) Field of Classification Search ............. 340/686.1, 340/686.6, 539.23, 539.26, 539.28, 540; 327/517
See application file for complete search history.

(56) References Cited

U.S. PATENT DOCUMENTS 7,142,167 B2 * 11/2006 Rochelle et al. ............. 343/867
2007/0032967 A1 * 2/2007 Feen et al. .................... 702/47
2008/0266083 A1 * 10/2008 Midholt et al. .............. 340/540

OTHER PUBLICATIONS

Analog Devices, Inc., Ultra Low Power, 2 Channel, Capacitance Converter for Proximity Sensing, pp. 1-28, Rev. PrD., Nov. 2006.
Analog Devices, Inc., Programmable Controller for Capacitance Touch Sensors, pp. 1-72, Rev. A. 2007.
Quantum Research Group, "QT100A Charge-Transfer QTouch IC", Quantum Research Group datasheet QT100A_1R7.01_0308, published Mar. 2008.
Quantum Research Group, "QT60160, QT60240 16 and 24 Key QMatrix Touch Sensor ICs", Quantum Research Group datasheet QT160240-ISG R8.06/0906, published Sep. 2006.

* cited by examiner

*Primary Examiner*—Toan N Pham
(74) *Attorney, Agent, or Firm*—Kenyon & Kenyon LLP

(57) ABSTRACT

Proximity detection is accomplished by determining with a moving average calculation a moving average level of input data; setting a threshold level in response to the average level and a sensitivity factor; producing a proximity detection output when the input data meets the threshold level; and changing the weighting used by the average level calculation in response to a proximity detection output.

23 Claims, 10 Drawing Sheets

US 7,884,733 B2

PROXIMITY DETECTION SYSTEM AND METHOD

RELATED APPLICATIONS

This application claims benefit of and priority to U.S. Provisional Application Ser. No. 60/931,446 filed May 23, 2007, incorporated herein by this reference.

FIELD OF THE INVENTION

This invention relates to a proximity detection system such as a rain or touch sensor and more particularly to improvements in generating and controlling background average levels for determining proximity detection.

BACKGROUND OF THE INVENTION

Conventional proximity detection, e.g. touch and rain sensors typically rely on a moving average to represent slowly varying environmental background conditions against which valid signals can be detected above a selected threshold. A problem with sensors such as proximity detectors is that once a spurious touch indication has occurred the system blocks out further valid touches until that spurious touch indication ends so subsequent touches are not detected, i.e. locked out. One solution to this has been to simply time-out the system. That is, if a touch is detected for more than a predetermined period of time, a timer resets the system to the new level. Thus this approach ignores, finally, the present touch and will not recognize another touch occurring before the timer resets to the new level. Another problem with maintaining the proper background average in conventional approaches is that, if the background average increases above the present level or decreases below it and stays there, the system is designed to simply reset after a period of time which is the same whether the average has increased or decreased. This obscures the difference between physical realities that cause those shifts in average. For example, an increase in background average may indicate that something is touching the sensor as a new background condition and the system should incorporate that increase only if it persists long enough. Conversely, if the background average level decreases the system will fail to detect a touch even if it is well over the threshold relative to the new lower level because the system is still abiding by the established higher background average level.

SUMMARY OF THE INVENTION

It is therefore an object of this invention to provide an improved proximity detection system and method.

It is a further object of this invention to provide such an improved proximity detection system and method with improved background average level generation and control.

It is a further object of this invention to provide such an improved proximity detection system and method which overcomes system lock-up caused by prolonged proximity.

It is a further object of this invention to provide such an improved proximity detection system and method which gradually updates background average level during prolonged proximity to permit detection of subsequent/additional proximity.

It is a further object of this invention to provide such an improved proximity detection system and method which reduces the potential for missing detections because of either a prolonged proximity or a sustained decrease in background average level.

It is a further object of this invention to provide such an improved proximity detection system and method which resets the background average level at different speeds when the data dwells significantly above the average level compared to when the data dwells significantly below the average level.

The invention results from the realization that truly improved, less costly and more effective proximity detection can be accomplished by adding any one or more background average level generation and control factors including reducing the weighting used in the average level calculation in response to a proximate detection output which overcomes lockup due to prolonged proximity and resetting the average level when the data level has been above the average level for one period of time and when the average level has been above the data level for a second period of time which addresses the different response required for a extended elevated data level indicating a prolonged proximity event and for a drop in background average level which can cause loss of valid proximity events.

The subject invention, however, in other embodiments, need not achieve all these objectives and the claims hereof should not be limited to structures or methods capable of achieving these objectives.

This invention features a proximity detection system including a moving average calculation circuit responsive to input data to determine a moving average level of that data. A threshold circuit responds to the average level and a sensitivity factor for setting a threshold level. A comparator device produces a proximity detection output when the input data meets the threshold level. A background average level adjustment circuit changes the weighting used in the average level calculation in response to a proximity detection output.

In a preferred embodiment the background average level adjustment circuit may include a switching circuit for selectively applying a lower weighting to the moving average calculation circuit in response to a proximity detection output.

This invention also features a proximity detection system including a moving average calculation circuit responsive to input data to determine a moving average level of that data. A threshold circuit responds to the average level and a sensitivity factor for setting a threshold level. A comparator device produces a proximity detection output when the input data meets the threshold level. A reset timer circuit resets the average level when the data level has been above the average level for a first predetermined time and/or when the average level has been above the data level for a second predetermined time.

In a preferred embodiment the first time may be longer than the second time. The reset timer circuit may reset the average level to the data level. The threshold circuit may include a first threshold circuit for generating a first threshold from the average level plus the sensitivity factor and a second threshold circuit for generating a second threshold from the average level minus the sensitivity factor. The reset timer circuit may include a first comparator circuit for providing an output when the data level meets the first threshold and a second comparator for providing an output when the data level meets the second threshold. The reset timer circuit may include a first timer responsive to a first predetermined number of outputs of the first comparator circuit to reset the average level, and a second timer responsive to a second predetermined number of outputs of the second comparator circuit to reset the average level.

This invention also features a proximity detection system including a moving average calculation circuit responsive to input data to determine a moving average level of that data. A threshold circuit responds to the average level and a sensitivity factor for setting a threshold level. A comparator device produces a proximity detection output when the input data meets the threshold level. A background average level adjustment circuit changes the weighting used by the average level calculation in response to a proximity detection output. A reset timer circuit resets the average level when the data level has been above the average level for a first predetermined time and/or when the average level has been above the data level for a second predetermined time.

In a preferred embodiment the background average level adjustment circuit may include a switching circuit for selectively applying a lower weighting to the moving average calculation circuit in response to a proximity detection output. The first time may be longer than the second time. The reset timer circuit may reset the average level to the data level. The threshold circuit may include a first threshold circuit for generating a first threshold from the average level plus the sensitivity factor and a second threshold circuit for generating a second threshold from the average level minus the sensitivity factor. The reset timer circuit may include a first comparator circuit for providing an output when the data level meets the first threshold and a second comparator for providing an output when the data level meets the second threshold. The reset timer circuit may include a first timer responsive to a first predetermined number of outputs of the first comparator circuit to reset the average level, and a second timer responsive to a second predetermined number of outputs of the second comparator circuit to reset the average level.

This invention also features a proximity detection method including determining with a moving average calculation a moving average level of input data, setting a threshold level in response to the average level and a sensitivity factor, producing a proximity detection output when the input data meets the threshold level and changing the weighting used by the average level calculation in response to a proximity detection output.

In a preferred embodiment changing the weighting used by the moving average calculation may include use of a lower weighting for the moving average calculation in response to a proximity detection output.

This invention also features a proximity detection method including determining with a moving average calculation a moving average level of input data, setting a threshold level responsive to the average level and a sensitivity factor, producing a proximity detection output when the input data meets the threshold level and resetting the average level when the data level has been above the average level for a first predetermined time and/or when the average level has been above the data level for a second predetermined time.

In a preferred embodiment the first time may be longer than the second time. The resetting may reset the average level to the data level. Setting a threshold level may include generating a first threshold from the average level plus the sensitivity factor and generating a second threshold from the average level minus the sensitivity factor. The resetting may include a comparator circuit for providing a first output when the data level meets the first threshold and a second output when the data level meets the second threshold. The resetting may include resetting the average level in response to a first predetermined number of first outputs and resetting the average level in response to a second predetermined number of second outputs.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
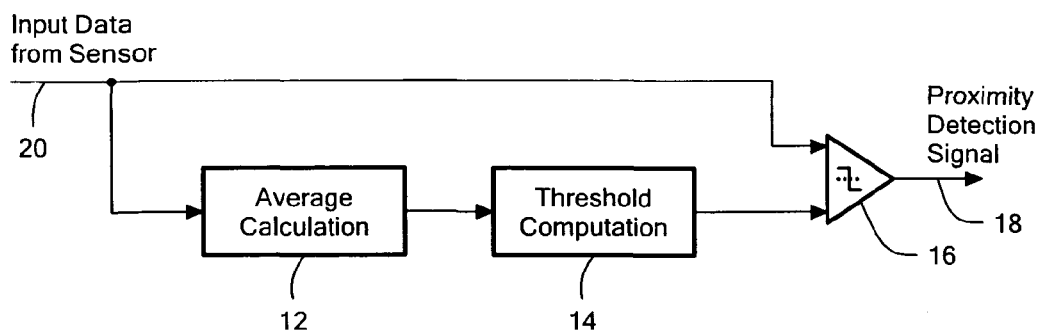
FIG. 1 is a schematic block diagram for a prior art proximity sensor.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 a prior art proximity detector 10 including an average calculation circuit 12, threshold computation circuit 14, and a comparator 16. In operation the input data is delivered directly to one input of comparator 16 and also to the average calculation circuit 12 which calculates the average over some period of time or number of input data samples. That background average level is then submitted to threshold computation circuit 14 which adds a sensitivity factor to construct a threshold and delivers that threshold to comparator 16. If the threshold value is met by the input data a proximity detection signal is provided at output 18. The threshold can be met by an input data value at input 20 which is equal to or greater than the threshold. The input data can come from any kind sensor or data acquisition device such as e.g., strain gauges, magnetic sensors, capacitive sensors. While the word circuit is used herein to refer to components they may also be understood as blocks when the implementation involves software.

Figure 2:
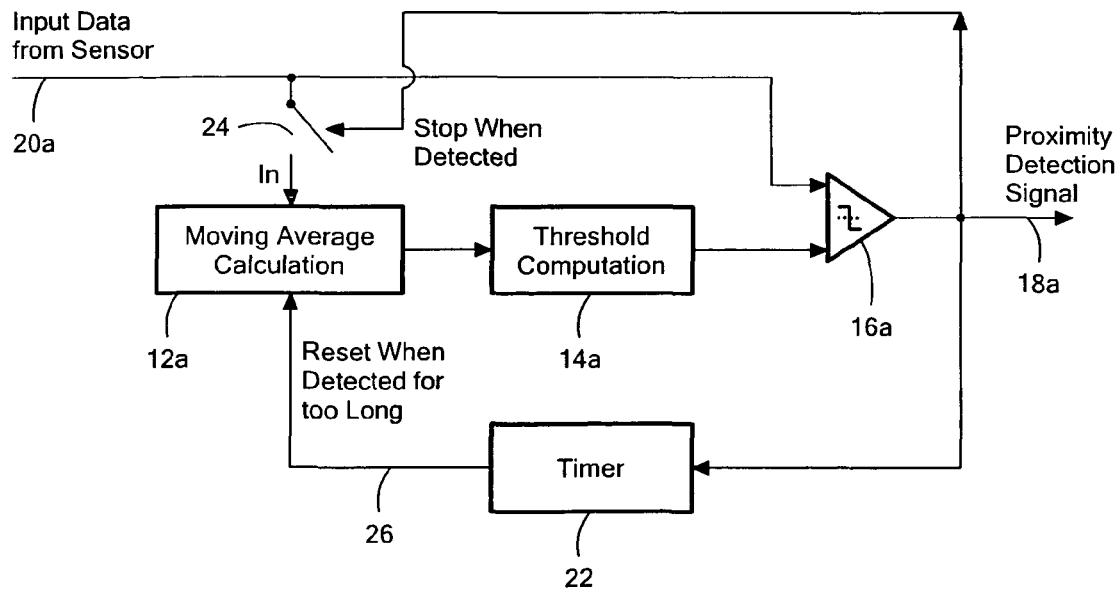
FIG. 2 is a schematic block diagram similar to FIG. 1 showing a prior art background level suppression circuit.
Figure 3:
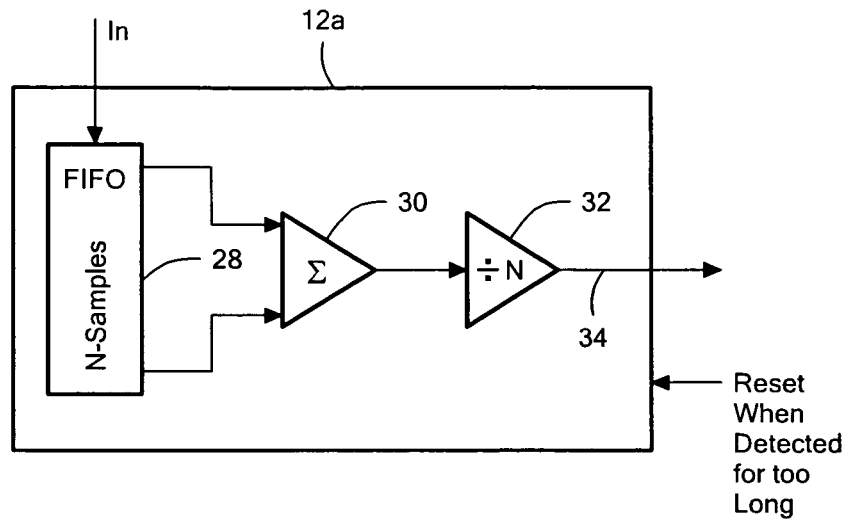
FIG. 3 is a schematic block diagram similar to FIG. 1 showing a prior art moving average calculation circuit.

Typically a prior art proximity detection system 10a, FIG. 2, includes a moving average calculation circuit 12a, a timer 22, and a switch circuit 24. As explained in the background, a proximity detection signal occurs at 18a when input 20a exceeds the threshold computed at 14a from the moving average. Switch circuit 24 operates to cut off further background level averaging when a proximity detection signal occurs at 18a. At that point switch 24 is open and the current average data level is frozen. If the input change at 20a which caused proximity detection is sustained then the average will not adjust to track this and the system is locked up preventing further proximity events from being detected. Timer 22 also responds to a proximity detection signal by providing a reset signal on line 26 to moving average calculation circuit 12a. Moving average calculation circuit 12a, FIG. 3, typically includes a FIFO storage device 28, a summing device 30, for adding together all of input data and a divide by N circuit 32 which produces the background average level at 34. Such storage devices as FIFO storage device 28 are relatively expensive and require a significant amount of chip real estate in the case of an integrated circuit implementation.

Figure 4:
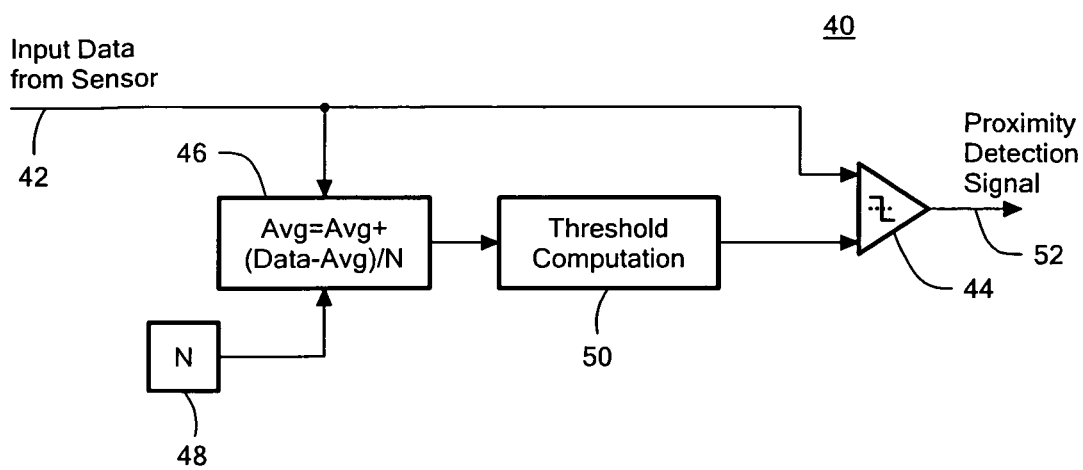
FIG. 4 is a schematic block diagram of a proximity sensor with an exponential moving average calculation circuit.

Proximity detection system 40, FIG. 4, according to this invention receives input data on line 42 which is fed directly to one input of comparator 44. Input data is also delivered to moving average calculation circuit 46 which is shown here as an exponential moving average calculation device which calculates the moving average without the need for a special storage device. It generates the average by adding the present average to the sum of the input data minus that average divided by N where N is an averaging factor. The term 1/N is a weighting term which reflects the weighting of the new data on the average. The larger weighting term 1/N is, the greater impact the new data will have on the average, and the faster the average will react to a step change in the input data of a given magnitude. The number N may be loaded in a register 48 so that it may be readily changed if desired. Threshold computation circuit 50 responds to the background average level by adding a sensitivity factor to provide the reference or threshold to comparator 44. Again, if the input data is greater that the threshold level a proximity detection signal is provided at output 52.

Figure 5:
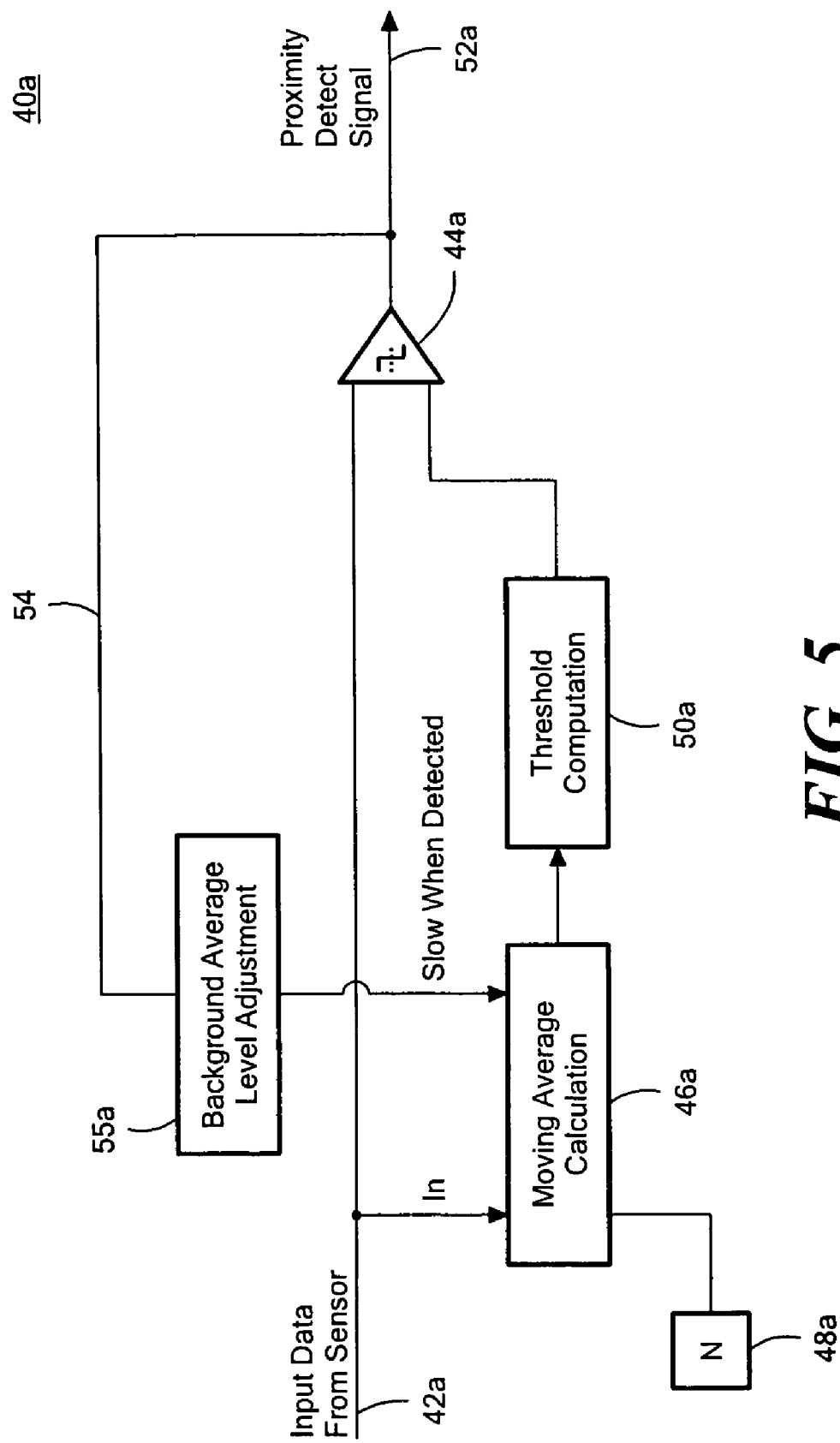
FIG. 5 is a schematic block diagram of a proximity sensor with background average level adjustment circuit according to this invention.

A feature of this invention is shown in FIG. 5, where a proximity detection signal on output 52a is fed back to moving average calculation circuit 46a to slow down the averaging operation to address the problem of a prolonged proximity detection which may indicate that in fact the background average level has encountered a new condition. By controlling the background average level to change slowly, rather than to simply cut it of as in the prior art, lockup is prevented and the system is enabled to recover and to detect subsequent proximity events. The proximity detection signal at output 52a is fed back, for example, on line 54 through background average level adjustment circuit 55a to moving average calculation circuit 46a where it can slow the averaging operation by, for example, reducing the value of N or by multiplying weighting factor 1/N by some constant K.

Figure 6:
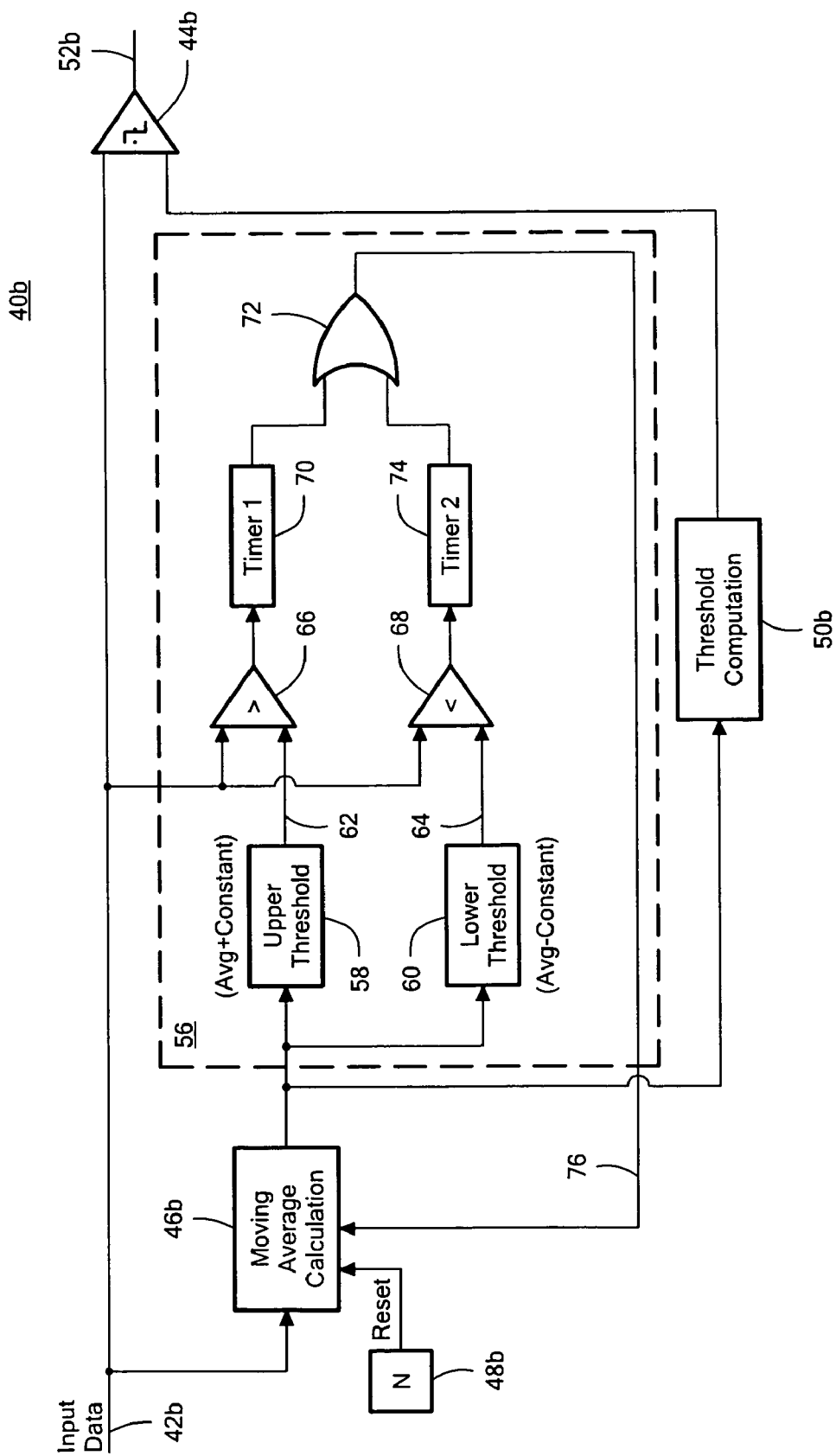
FIG. 6 is a schematic block diagram of a proximity sensor with reset timer circuit according to this invention.

Proximity system 40b, FIG. 6, according to this invention may also include a reset timer circuit for resetting the average level when the data level has been above the average level for some period of time and/or when the average level has been above the data level for, typically a different, period of time. For example, when the data level has been above the average level for a period of time the average level can be reset. Also when the average level has been above the data level for a period of time the average level can be reset. These typically may be different times. For example, the system may be willing to wait a bit longer to reset when the data level is above the average level but desire to reset more quickly when the average level is above the data level. Note that the resetting of the average level may be to the current level or some other desired level. Reset timer circuit 56 includes a first upper threshold circuit 58 which creates a first threshold from the sum of the background average level and a sensitivity constant. A second lower threshold circuit 60 creates a second threshold from the difference of the background average level and a sensitivity constant. The first and second thresholds are delivered on lines 62 and 64 to comparators 66 and 68, respectively. First timer 70 is stepped along each time comparator 66 indicates that the input data on line 42b is above the first or upper threshold. When first timer 70 reaches a predetermined count, for example X it sends a signal to OR gate 72. If before the count of X is reached input data on line 42b falls below the threshold on line 62 timer 70 is reset and begins to count again. Comparator 68 similarly services second timer 74 which counts for a period of, for example, Y before it will provide an output to OR gate 72. If in that case the background average level is higher than the input data, that is the threshold on line 64 is higher than the input data on line 42b, comparator 68 provides a count to the second timer 74. The times X and Y may be different as indicated before in order to address different physical realities being seen by the proximity detection system. When an output is provided by OR gate 72 a signal is returned on line 76 to reset moving average calculation circuit 46b. It may be reset to any desired level. Typically it may be set to the current background average level. It should be understood that the invention has been explained in FIGS. 4-6 as operating on a positive configuration of input data, but the opposite could be true in which case the configuration of the circuits would be simply inverted as well.

Figure 7:
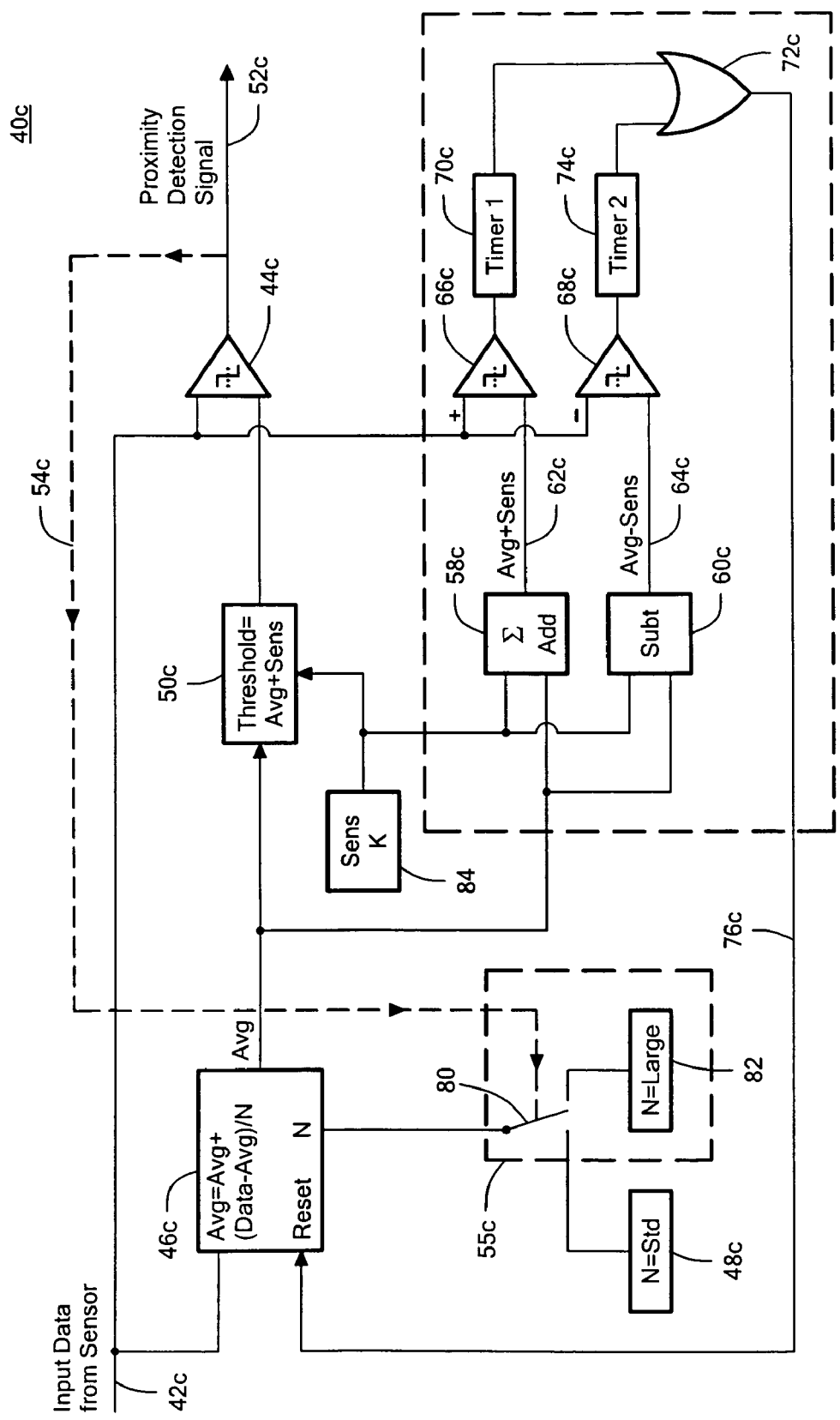
FIG. 7 is a schematic block diagram of a proximity sensor showing the exponential moving average calculation circuit, background level adjustment circuit, and reset timer circuit of FIGS. 4-6.

The entire system 40c including the reset timer circuit 56 and background level adjustment circuit 55c are shown in FIG. 7. There, all of the features of the invention are shown in one configuration. And the background average level adjustment circuit 55c is shown in greater detail as including symbolically, a switch 80 driven by a proximity detection signal on output 52c delivered along line 54c to move from the standard N 48c to a larger N 82 in order to slow down the averaging process. Alternatively, as indicated previously the entire fraction 1/N could be multiplied by a constant K to accomplish the same result. Also in system 40c the sensitivity factor is shown generated at 84 and provided both to the threshold circuit 50c as well as the upper and lower threshold generating circuits 58c and 60c, respectively.

Figure 8:
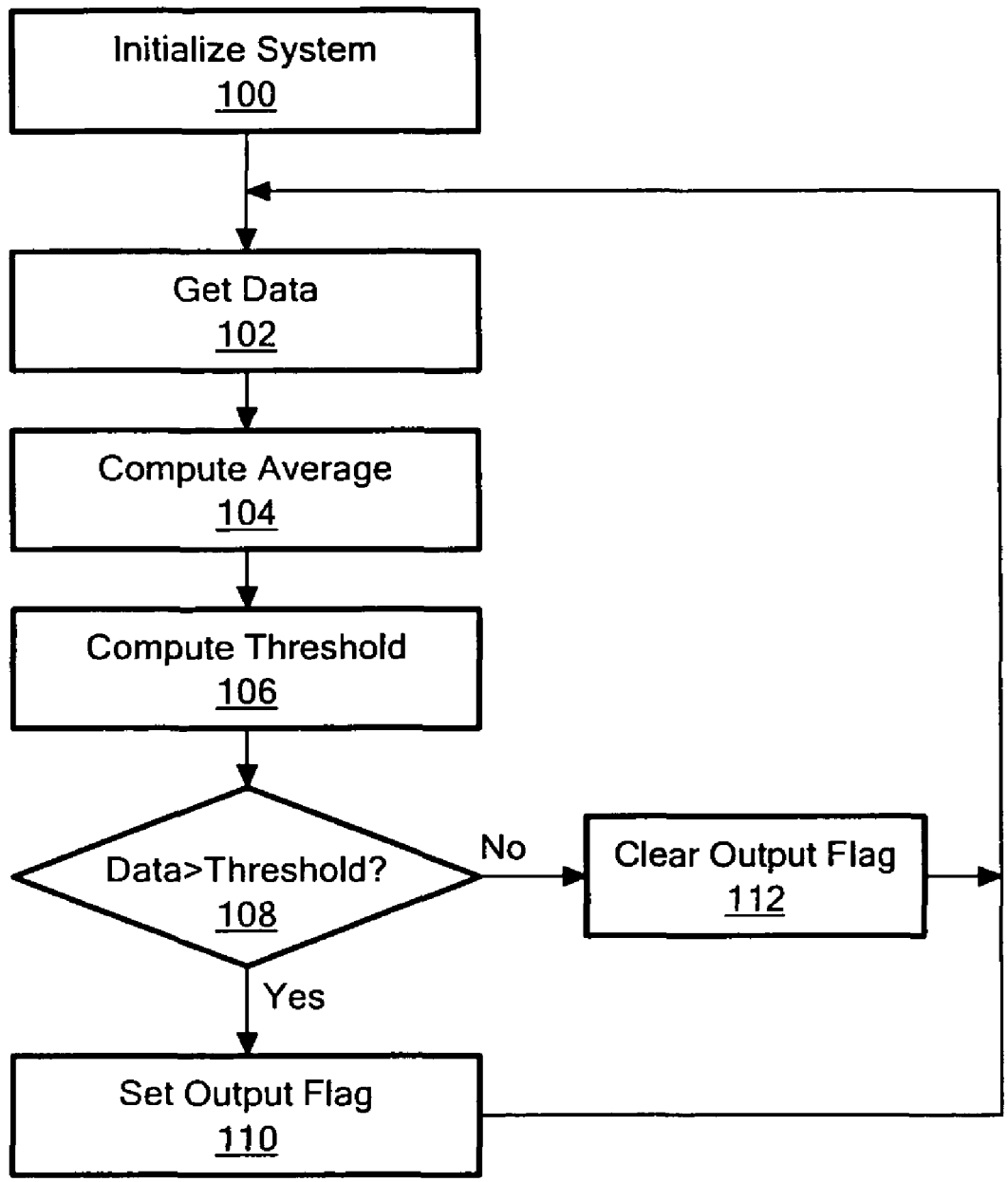
FIG. 8 is a flow chart of a prior art proximity detection system.

The prior art method 98 as indicated in the flow chart in FIG. 8, begins with initializing the system 100, and then getting the data at 102. The average is then computed 104, as is the threshold 106, which is compared to the data and the decision 108 is made, if the data is greater than the threshold the output flag is set 110, if it is not, the flag is cleared 112 and the system returns to get data again at 102.

Figure 9:
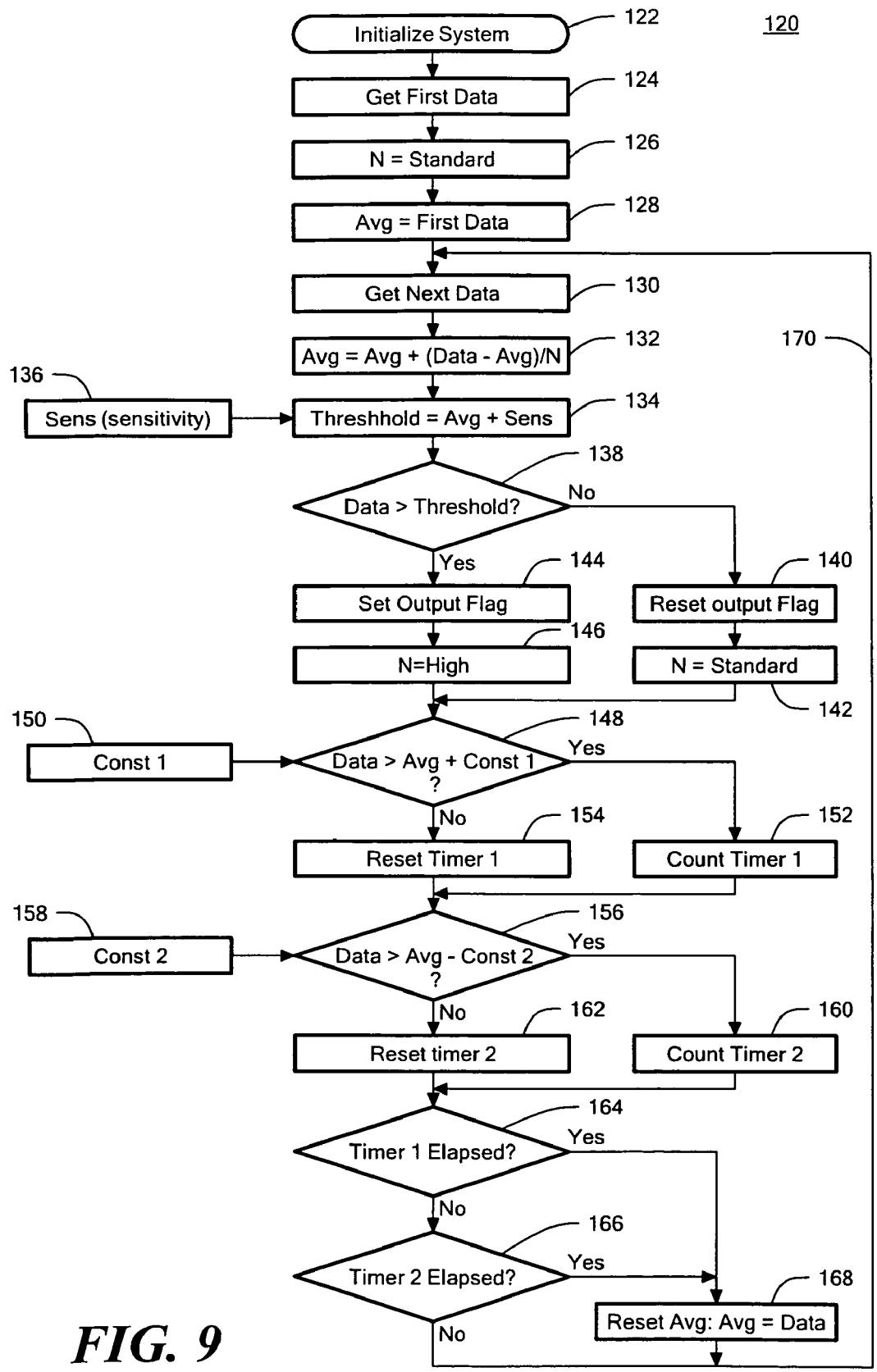
FIG. 9 is a flow chart of the proximity detection method using an exponential moving average calculation, and the timer reset and background average level adjustment methods of this invention.

The method 120 in accordance with this invention, FIG. 9, which may be implemented using software or firmware in a microcontroller, begins by initializing the system 122 and then getting the first data 124. The averaging standard or factor N is set 126 and the average is initialized to the first data 128. Then the next data is obtained 130. In accordance with the exponential moving average calculation 132, the average is added to the input data minus the average divided by the average factor N. The threshold is then constructed 134 using the sensitivity factor 136. If the data is not greater than the threshold 138 the output flag is reset 140 and the system refers again to the standard N 142. If, however, the data is greater than the threshold the output flag is set 144 and the new higher N 146 is employed to slow down the averaging operation. The decision is then made 148 as to whether the data is greater than the average plus some constant, which here is denominated constant 1 available at 150. If it is, a timer is stepped 152; if it is not the timer is reset 154. Similarly, a decision is then made 156 as to whether the data is greater than the average minus another constant called constant 2 here available at 158. If it is then the second timer is stepped 160; if it is not that timer is reset 162. The constants 1 and 2 may be any desired value but they may normally but not necessarily be the sensitivity factor referred to in FIGS. 6 and 7. If either timer 1 has elapsed 164 or timer 2 has elapsed 166, the background average level is reset 168 and the system returns on line 170 to get the next data 130. At 168 it is shown as being reset to the data but it need not be: any desired level could be used. If timer 1 has not been elapsed and timer 2 is not elapsed then the system also returns on line 170 to get the next data.

Figure 10:
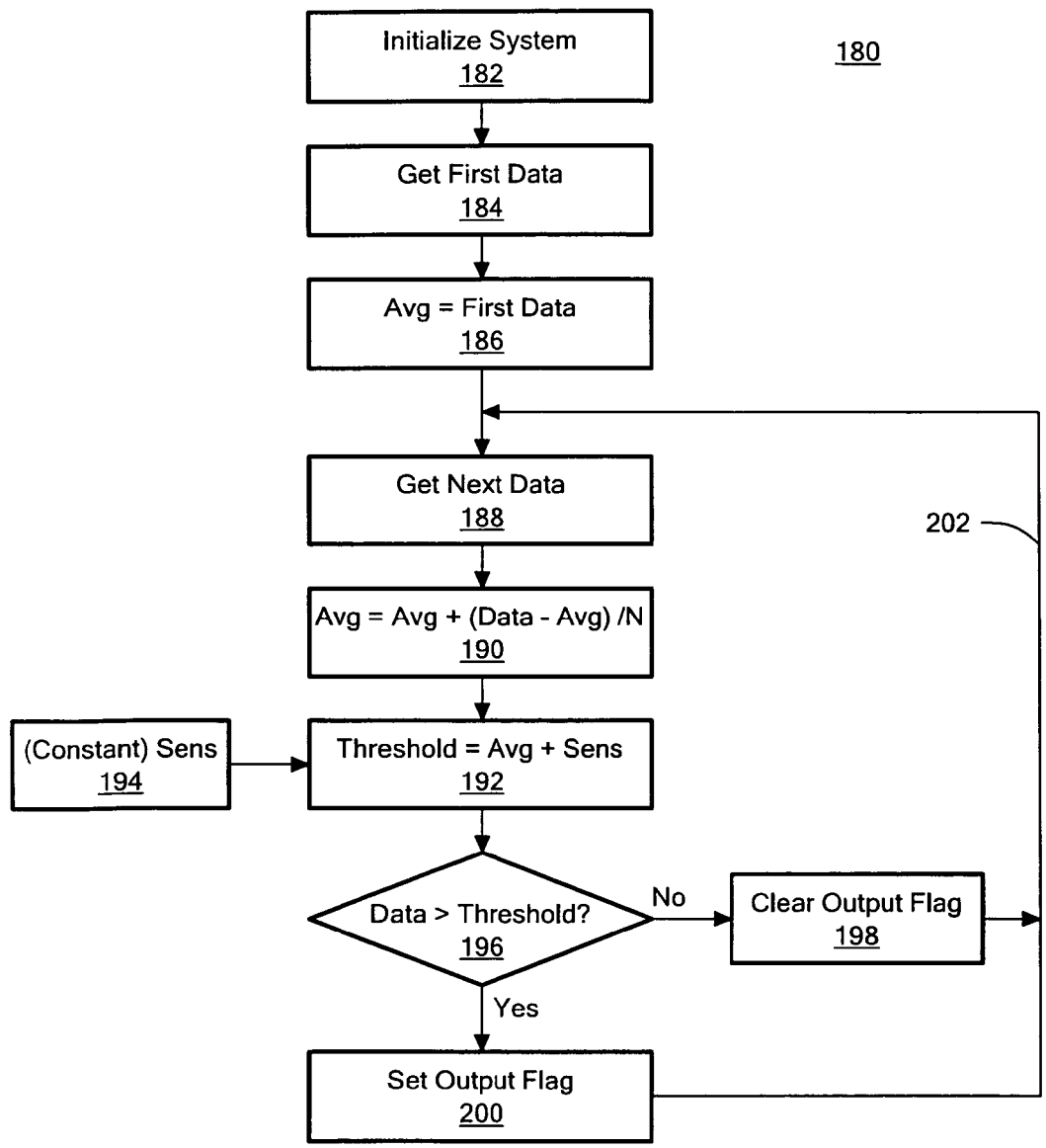
FIG. 10 is a more detailed flow chart of exponential moving average calculation method of FIG. 9.

The method employed in the exponential moving average calculation method 180, FIG. 10, includes, after initializing the system 182, getting the first data 184, setting the average equal to the first data 186, getting the next data 188 and then using the exponential moving average calculation (adding the average to the data minus the average divided by the averaging factor N 190). The threshold 192 is then calculated using that average plus a constant such as the sensitivity factor 194. The decision is then made as to whether the data is greater than the threshold 196. If it is not, then at 198 the output is cleared and the flag is set and the system returns on line 202 to get the next data 188. If the data is greater than the threshold then the output flag is set 200 and the system returns again on 202 to get the next data 188.

Figure 11:
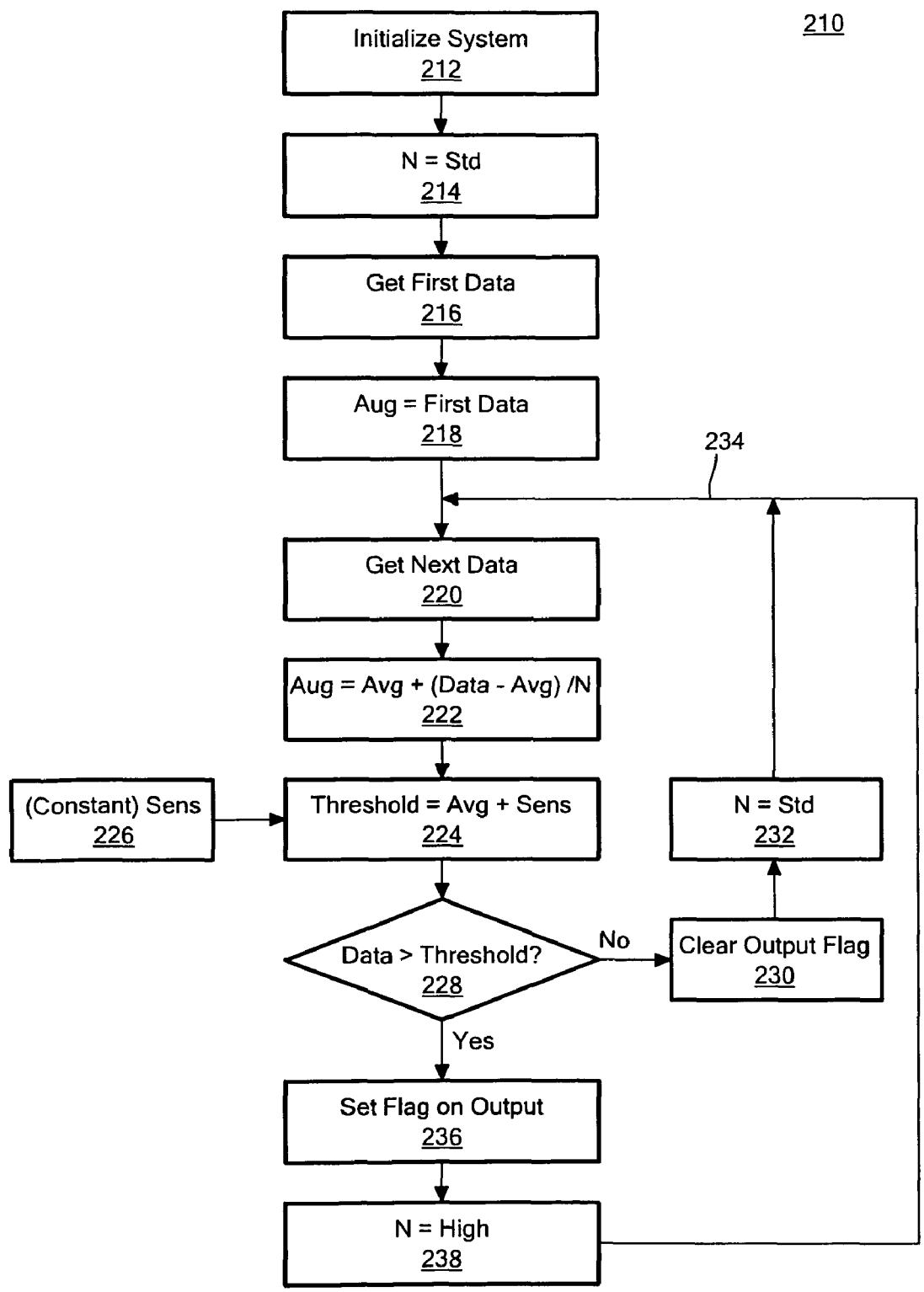
FIG. 11 is a more detailed flow chart of the background average level adjusted method of FIG. 9.

The method of reducing the rate of the average level calculation 210, FIG. 11, begins with initializing the system 212 then setting the average factor N to a standard value 214. The first data is gotten 216 and the average is set to the first data 218. The next data is gotten 220 and then the exponential moving average calculation 222 is executed by adding the average to the data minus the average divided by N. The threshold is then calculated 224 using a constant such as the sensitivity 226. The decision is then made 228 as to whether the data is greater than the threshold. If it is not the output flag is cleared 230, N is kept at standard 232, and the system returns on line 234 to get the next data 220. If the data is greater than the threshold then the flag is set for the output 236 and the average factor N is set to the higher level 238 to slow down the averaging operation and the system returns on line 234 to get the next data 220.

Figure 12:
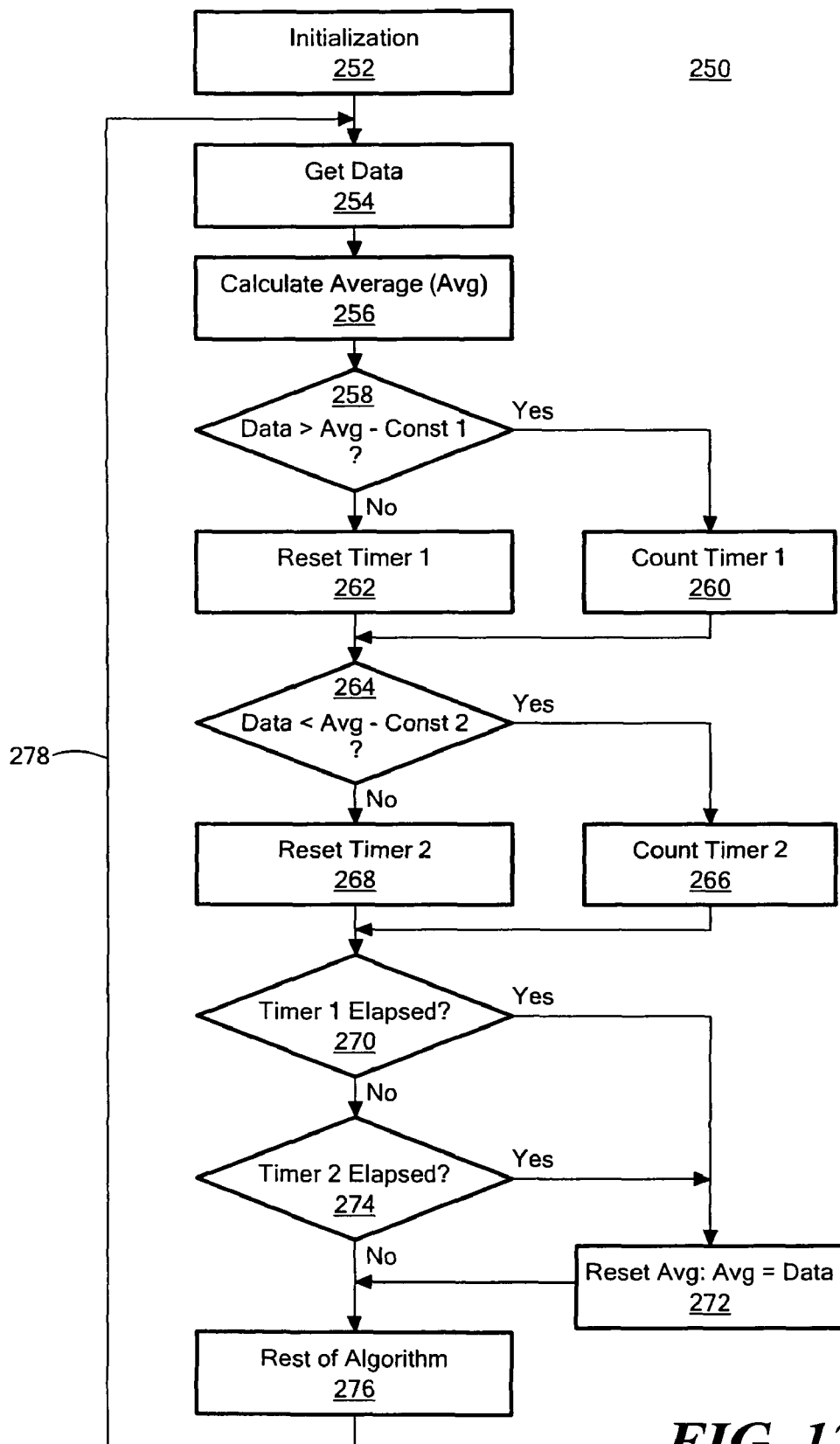
FIG. 12 is a more detailed flow chart of the reset timer method of FIG. 9.

The method 250, FIG. 12, of resetting the average level for the two different conditions, one when the data level has been above the average level for a predetermined time and two when the average level has been above the data level for a separate predetermined time. This method begins with the initialization 252. Then the data is gotten 254 and the average is calculated 256. A decision is then made 258 as to whether the data is greater than the average plus a first constant, for example, the sensitivity factor. If it is, a first timer is stepped 260, if it is not that timer is reset 262. In either case the system now approaches a decision 264 as to whether the data is greater than the average minus that constant, for example, sensitivity factor. If it is, a second counter is stepped 266; if it is not, that timer is reset 268. In either case a check is then made to see if the first timer time has elapsed 270; if it has, then the average is reset 272, typically, but not necessarily, to the present level of the data. If the first time has not elapsed the second time is checked 274, if it has elapsed it also will reset the average 272. If it has not elapsed, the algorithm then continues 276 and returns on line 278 to get data 254.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A proximity detection system comprising:
    a moving average calculation circuit responsive to input data to determine a moving average level of that data;
    a threshold circuit responsive to said moving average level and a sensitivity factor for setting a threshold level;
    a comparator device for producing a proximity detection output when said input data meets said threshold level; and
    an adjustment circuit for changing a weighting used in the moving average calculation in response to the proximity detection output.

2. The proximity detection system of claim 1 in which said adjustment circuit includes a switching circuit for selectively applying a lower weighting to said moving average calculation circuit in response to the proximity detection output.

3. A proximity detection system comprising:
    a moving average calculation circuit responsive to input data to determine a moving average level of that data;
    a proximity detection threshold circuit responsive to said moving average level and a sensitivity factor for setting a proximity detection threshold level;
    a comparator device for producing a proximity detection output when said input data meets said proximity detection threshold level; and
    a reset timer circuit for resetting said moving average level when said data level has been above a first reset threshold based on said moving average level for a first predetermined time and/or when a second reset threshold based on said moving average level has been above said data level for a second predetermined time.

4. The proximity detection system of claim 3 in which said first predetermined time is longer than said second predetermined time.

5. The proximity detection system of claim 3 in which said reset timer circuit resets said moving average level to said data level.

6. The proximity detection system of claim 3, further including a first reset threshold circuit for generating the first reset threshold from the moving average level plus said sensitivity factor and a second reset threshold circuit for generating the second reset threshold from the moving average level minus said sensitivity factor.

7. The proximity detection system of claim 6 in which said reset timer circuit includes a first comparator circuit for providing an output when said data level meets said first reset threshold and a second comparator for providing an output when said data level meets said second reset threshold.

8. The proximity detection system of claim 7 in which said reset timer circuit includes a first timer responsive to a first predetermined number of outputs of said first comparator circuit to reset said moving average level, and a second timer responsive to a second predetermined number of outputs of said second comparator circuit to reset said moving average level.

9. A proximity detection system comprising:
a moving average calculation circuit responsive to input data to determine a moving average level of that data;
a proximity detection threshold circuit responsive to said moving average level and a sensitivity factor for setting a proximity detection threshold level;
a comparator device for producing a proximity detection output when said input data meets said proximity detection threshold level; and
an adjustment circuit for changing a weighting used by the average level calculation in response to the proximity detection output; and
a reset timer circuit for resetting said moving average level when said data level has been above a first reset threshold based on said moving average level for a first predetermined time and/or when a second reset threshold based on said moving average level has been above said data level for a second predetermined time.

10. The proximity detection system of claim 9 in which said adjustment circuit includes a switching circuit for selectively applying a lower weighting to said moving average calculation circuit in response to the proximity detection output.

11. The proximity detection system of claim 9 in which said first predetermined time is longer than said second predetermined time.

12. The proximity detection system of claim 9 in which said reset timer circuit resets said moving average level to said data level.

13. The proximity detection system of claim 9, further including a first reset threshold circuit for generating the first reset threshold from the moving average level plus said sensitivity factor and a second reset threshold circuit for generating the second reset threshold from the moving average level minus said sensitivity factor.

14. The proximity detection system of claim 13 in which said reset timer circuit includes a first comparator circuit for providing an output when said data level meets said first reset threshold and a second comparator for providing an output when said data level meets said second reset threshold.

15. The proximity detection system of claim 14 in which said reset timer circuit includes a first timer responsive to a first predetermined number of outputs of said first comparator circuit to reset said moving average level, and a second timer responsive to a second predetermined number of outputs of said second comparator circuit to reset said moving average level.

16. A proximity detection method comprising:
determining with a moving average calculation a moving average level of input data;
setting a threshold level in response to said moving average level and a sensitivity factor;
producing a proximity detection output when said input data meets said threshold level; and
changing a weighting used by the moving average calculation in response to the proximity detection output.

17. The proximity detection method of claim 16 in which changing the weighting used by the moving average calculation includes use of a lower weighting for said moving average calculation in response to the proximity detection output.

18. A proximity detection method comprising:
determining with a moving average calculation a moving average level of input data;
setting a proximity detection threshold level responsive to said moving average level and a sensitivity factor;
producing a proximity detection output when said input data meets said proximity detection threshold level; and
resetting said moving average level when said data level has been above a first reset threshold based on said moving average level for a first predetermined time and/or when a second reset threshold based on said moving average level has been above said data level for a second predetermined time.

19. The proximity detection method of claim 18 in which said first predetermined time is longer than said second predetermined time.

20. The proximity detection method of claim 18 in which said resetting resets said moving average level to said data level.

21. The proximity detection method of claim 18 in which setting a threshold level includes generating the first reset threshold from the moving average level plus said sensitivity factor and generating the second reset threshold from the moving average level minus said sensitivity factor.

22. The proximity detection method of claim 21 in which said resetting includes a comparator circuit for providing a first output when said data level meets said first reset threshold and a second output when said data level meets said second reset threshold.

23. The proximity detection method of claim 22 in which said resetting includes resetting said moving average level in response to a first predetermined number of first outputs; and resetting said moving average level in response to a second predetermined number of second outputs.

* * * * *